(12) United States Patent
Fukui

(10) Patent No.: US 6,465,537 B1
(45) Date of Patent: Oct. 15, 2002

(54) PHOTOCURABLE COMPOSITION, METHOD FOR PRODUCTION OF PHOTOCURABLE COMPOSITION, PHOTOCURABLE PRESSURE-SENSITIVE ADHESIVE AND METHOD FOR PRODUCTION OF PHOTOCURABLE PRESSURE—SENSITIVE ADHESIVE SHEET

(75) Inventor: Hiroji Fukui, Kyoto (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 09/720,290

(22) PCT Filed: Aug. 5, 1999

(86) PCT No.: PCT/JP99/04254

§ 371 (c)(1),
(2), (4) Date: Dec. 22, 2000

(87) PCT Pub. No.: WO00/12585

PCT Pub. Date: Mar. 9, 2000

(30) Foreign Application Priority Data

Aug. 28, 1998 (JP) ............................................. 10-243215

(51) Int. Cl.$^7$ ................................................. C08F 2/50
(52) U.S. Cl. ............................. 522/15; 522/25; 522/66; 522/100; 522/110; 522/111; 522/113; 522/120; 522/121; 522/122; 522/150; 522/153; 522/154; 522/170; 522/181; 522/182
(58) Field of Search ............................ 522/25, 66, 100, 522/170, 181, 182, 110, 113, 111, 122, 120, 121, 150, 153, 154, 15

(56) References Cited

U.S. PATENT DOCUMENTS

| | | | | | |
|---|---|---|---|---|---|
| 5,494,943 A | * | 2/1996 | Mohoney et al. | ............. | 522/66 |
| 5,554,664 A | * | 9/1996 | Lamanna et al. | ............. | 522/25 |
| 5,672,637 A | * | 9/1997 | Mahoney et al. | ............. | 522/25 |
| 5,883,193 A | * | 3/1999 | Karim et al. | ............... | 525/113 |

* cited by examiner

Primary Examiner—James J. Seidleck
Assistant Examiner—Sanza L. McClendon
(74) Attorney, Agent, or Firm—Townsend & Banta

(57) ABSTRACT

A photocurable composition is provided which can be produced and cured by both free-radical and cationic polymerization modes, which provides a sufficient length of open time to be bonded to an adherend, and which exhibts a good adhesive property.

A photocurable composition containing a compound (A) having at least one free-radically polymerizable unsaturated bond in a molecule, a compound (B) having at least one epoxy group in a molecule, a free-radical polymerization catalyst (C), a cationic polymerization catalyst (D) and a compound (E) represented by the following formula (1). Formula (1)

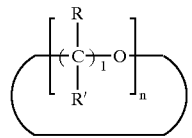

12 Claims, No Drawings

PHOTOCURABLE COMPOSITION, METHOD FOR PRODUCTION OF PHOTOCURABLE COMPOSITION, PHOTOCURABLE PRESSURE-SENSITIVE ADHESIVE AND METHOD FOR PRODUCTION OF PHOTOCURABLE PRESSURE— SENSITIVE ADHESIVE SHEET

TECHNICAL FIELD

The present invention relates to a photocurable composition, a photocurable pressure-sensitive adhesive utilizing the photocurable composition, and methods for producing the photocurable composition and photocurable pressure-sensitive adhesive. More particularly, the present invention relates to a photocurable composition which can be converted to a tackifying polymer via radical polymerization and finally caused to cure via cationic polymerization, a photocurable pressure-sensitive adhesive and methods for production thereof.

BACKGROUND ART

So-called pressure-sensitive adhesives have been proposed which facilitate bonding operations, eliminate safety concerns by excluding volatiles, and provide adhesive strength and film strength comparable in levels to general adhesives.

For example, Japanese Patent Laying-Open No. Hei 2-272076 discloses a pressure-sensitive adhesive tape using a pressure-sensitive thermally-curable adhesive prepared from a photopolymerizable composition containing an acrylate monomer and an epoxy resin. In the preparation of pressure-sensitive adhesive tape, only the acrylate monomer in the photopolymerizable composition is caused to polymerize. The pressure-sensitive tape such prepared is interposed between the adherends to combine them and then exposed to heat so that the epoxy resin is caused to cure to build sufficient adhesive strength.

However, the method disclosed in Japanese Patent Laying-Open No. Hei 2-272076 relies upon thermal cure of the epoxy resin to build the adhesive strength. This prevents application of the disclosed tape to adherends made from materials insufficient in heat-resistance, such as plastics, thereby limiting the type of the adherend to be bonded.

In Japanese Patent Kohyo No. 5-506465, a pressure-sensitive adhesive is disclosed containing a free-radically photopolymerizable component such as an acrylate monomer, a cationic photopolymerizable component such as an epoxy compound, and an organometallic complex salt initiator. This pressure-sensitive adhesive is proposed as providing enhanced tackiness. In the production of such a pressure-sensitive adhesive, the adhesive composition is irradiated so that its free-radically photopolymerizable component and cationic photopolymerizable component are both caused to undergo polymerization. That is, the concurrent initiation of free-radical polymerization and cationic polymerization results in constitution of the pressure-sensitive adhesive.

Accordingly, such polymerization reactions complete before the pressure-sensitive adhesive is formed, for example, into a sheet. The adhesive sheet is thus designed to show satisfactory strength when formed. While the resulting adhesive sheet exhibits sufficient tackiness to combine adherends, further enhancement in adhesive strength thereof is hardly expected even if an external stimulus, such as heat or radiation, is applied thereto.

Epoxy adhesives have been widely used to join various types of members for their capabilities to exhibit excellent creep resistance, light stability, water resistance, heat resistance, chemical resistance and the like after they have been cured, and to bond a wide variety of materials, such as metals, plastics and glasses ("Newly-revised Epoxy Resin", Hiroshi Kakiuchi, Shoko-do, published in 1985).

However, epoxy resin adhesives are generally used in a liquid form. The liquid form increases a tendency of the epoxy resin adhesives to be applied unevenly. The epoxy resin adhesive, when applied excessively, sometimes bleed out from joint surfaces to provide a poor appearance. Because of its liquid form, the epoxy resin adhesives can not be reapplied onto a surface once coated therewith. Also, the epoxy resin adhesives are generally supplied in two parts. This limits a mixing ratio of a curing agent to a base resin, and accordingly increases a tendency to produce adhesive defects as a result of incorrect mixing.

As a solution to the aforementioned problems, sheet- or film-form epoxy resin adhesives have been proposed (Japanese Patent Laying-Open No. Sho 60-173076). Such sheet-form epoxy resin adhesives however lack provisional holding properties because of their inherent high elastic modulus and low initial adhesive strength in an ordinary state. This has led to a problem of insufficient workability during a joint operation. Also, the sheet-form epoxy resin adhesives exhibit insufficient adhesion to adherends. In order to firmly join those adherends, they must be placed under severe curing conditions, such as hot pressing or pressing at elevated pressures. This prevents its application to adherends which can not endure such severe curing conditions.

The inventors of the present application have previously proposed a photopolymerizable composition which can be polymerized by two different modes (Japanese Patent Laying-Open No. Hei 9-279013). This composition contains a free-radically polymerizable monomer such as an acrylic monomer, a free-radical polymerization catalyst, an epoxy-containing compound, and a cationic polymerization catalyst capable of initiating cure of the epoxy-containing compound. Here, the photopolymerizable composition is pre-irradiated to activate the free-radical polymerization catalyst which initiates polymerization of the free-radically polymerizable monomer. After production of a tackifying polymer, the composition is formed into a sheet. When in use, this sheet is irradiated so that the cationic polymerization catalyst is activated to initiate curing of the epoxy resin, thereby obtaining satisfactory adhesive strength.

However, there remains a problem that the sheet must be left to react for a long period of time after it has been irradiated in order to perfect the cure of the epoxy resin.

Also, the inventors of the present application have previously proposed a curable pressure-sensitive adhesive which can achieve joining of adherends under the curing conditions that impose little restriction on the types of the adherends used (Japanese Patent Laying-Open No. Hei 10-120988). The reference discloses a curable pressure-sensitive adhesive sheet which contains an acrylic polymer, an epoxy resin and a cationic photopolymerization initiator. When this curable pressure-sensitive adhesive sheet is irradiated, the cationic photopolymerization initiator is activated to initiate curing of the epoxy resin. Therefore, the mere irradiation of curable pressure-sensitive adhesive sheet, either before or after it is applied to an adherend, results in providing firm adhesion between the adherends.

The heat-resistance of adherends can be left out of consideration.

However, the above-described curing reaction is caused to proceed as soon as the curable pressure-sensitive adhesive sheet is irradiated. Within a short period of time, the curable pressure-sensitive adhesive sheet shows a marked increase in elastic modulus. If this results, the curable pressure-sensitive adhesive sheet loses a sufficient tackiness to adhere to adherends. That is, there remains a problem that a period of time the adhesive sheet remains uncured after it has been irradiated, i.e., an open time, is short.

The inventors of the present application have found that the addition of. vinyl ether compounds successfully extends the open time of the aforementioned curable pressure-sensitive adhesive sheet (EPO 819746 A2). However, the increase in adhesion strength of the adhesive sheet when cured was in some cases insufficient.

In Japanese Patent Laying-Open No. Sho 63-248825, a slow-curing type UV-curable epoxy resin composition is disclosed which incorporates a fixing agent containing a poly(alkylene oxide) residue portion. Here, the fixing agent containing a poly(alkylene oxide) residue portion is added to reduce the occurrence of a so-called skinning phenomenon whereby photocurable epoxy resin compositions lose their surface wettability or tackiness soon after they are exposed to an ultraviolet light.

However, the addition of fixing agent containing a poly (alkylene oxide) residue portion is directed:to develop an adhesive property, as well as to prevent the occurrence of skinning. It has been accordingly difficult to design such skinning-preventive and adhesive performances independently.

Japanese Patent Laying-Open No. Hei 3-172378 discloses photocurable epoxy adhesive compositions incorporating an epoxide cure retarder selected from the group consisting of nitrile- or vinyl ether-substituted organic materials. Here, the use of vinyl ether-substituted organic materials is reported to assure an open time of about 40 minutes for the photocurable epoxy, adhesive compositions. No reference is however made as to the adhesive property, i.e., adhesive strength of such adhesive compositions.

DISCLOSURE OF THE INVENTION

In view of the current state of the art as described above, it is an object of the present invention to provide a photocurable composition which can undergo polymerization by free-radical and cationic modes, with one. of those modes being-effective to cure the composition. This photocurable composition places little restriction on the types of the adherends used, provides an extended open time and, after cured, exhibits good adhesion strength.

It is another object of the present invention to provide a photocurable pressure-sensitive adhesive sheet which is obtainable by rendering the aforementioned photo-curable composition into a sheet form, and which provides an extended open time and, after cured, exhibits good adhesion strength.

A further object of the present invention is to provide methods for production of the aforementioned photocurable composition and photocurable pressure-sensitive adhesive sheet.

In accordance with a broad aspect of the present invention, a photocurable composition is provided which is characterized as containing (A) a compound having at least one free-radically polymerizable unsaturated bond in a molecule, (B) a compound having at least one epoxy group in a molecule, (C) a free-radical polymerization catalyst being activatable by irradiation for initiating polymerization of the compound (A), (D) an onium salt compound functioning as a cationic polymerization catalyst, and (E) a compound represented by the following formula (1).

Formula (1)

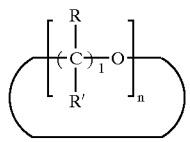

(wherein R and R' are suitably selected from hydrogen, halogen, saturated hydrocarbon groups, unsaturated hydrocarbon groups, substituting groups comprised of any suitable combination of elements'such as carbon, hydrogen, oxygen, nitrogen and sulfur, and the like; and 1, n each is an integer of 2 or larger).

The above-specified photocurable composition is hereinafter referred to as a first photocurable composition.

In a particular aspect of the present invention, the above-defined compound (A) may comprise a combination of a compound (A-1) having at lease one (meth)acryloyl group and at least one hydroxyl group in a molecule and a compound (A-2) having an unsaturated bond copolymerizable with the compound (A-1).

In another particular aspect of the present invention, the free-radical photopolymerization initiator (C) is activatable by exposure to light that includes a wavelength region of 370–800 nm to initiate polymerization of the compound (A), while the compound (D) is an onium salt compound which, responsive to a light that includes a wavelength region of 300–370 nm, initiates polymerization or cure of at least the compound (B).

In accordance with another broad aspect of the present invention, a photocurable composition is provided which contains (A-3) a tackifying polymer made via photo polymerization of a compound (A) having at least one free-radically polymerizable unsaturated bond in a molecule, (B) a compound having at least one epoxy group in a molecule, (D) an onium salt compound functioning as a cationic polymerization catalyst, and (E) a compound represented by the formula (1). This photocurable composition is hereinafter referred-to as a second photocurable composition.

In accordance with a further broad aspect of the present invention, a method for production of a photocurable composition is provided wherein the photocurable composition is obtained by irradiating the above-specified photocurable composition according to the present invention so that the free-radical polymerization catalyst (C) is activated to initiate polymerization of the compound (A).

In accordance with a further aspect of the present invention, a photocurable pressure-sensitive adhesive sheet is provided which can be obtained by rendering the photocurable composition according to the present invention into a sheet form.

In accordance with a further aspect of the. present invention, a method for production of a photocurable pressure-sensitive adhesive sheet is provided which is characterized as comprising the steps of coating the photocurable composition according to the present invention, and irradiating the coated photocurable composition so that the free-radical polymerization catalyst (C) is activated to initiate polymerization of the compound (A).

The present invention will be now described in detail.

The first photocurable composition in accordance with the present invention contains the compound (A) having at least one free-radically polymerizable unsaturated bond in a molecule. The free-radical polymerization of the compound (A) is initiated upon activation of the free-radical polymerization catalyst (C) to result in the tackifying polymer (A-3) for the photocurable composition according to the invention as recited in claim 4.

The compound (A) having at least one free-radically polymerizable unsaturated bond in a molecule is not particularly specified, so long as it has an unsaturated bond which can participate in free-radical polymerization. Examples include styrene derivatives, vinyl ester-containing compounds, acryloyl-containing compounds, methacryloyl-containing compounds and the like. Also useful are compounds that contain a combination of different types of free-radically polymerizable unsaturated bonds.

Specific examples of styrene derivatives include styrene, indene, p-methylstyrene, α-methylstyrene, p-methoxystyrene, p-tert-butoxystyrene, p-chloromethyl styrene, p-acetoxystyrene, divinylbenzene.

Examples of vinyl ester-containing compounds include vinyl acetate, vinyl propionate, vinyl butyrate, vinyl caproate, vinyl cinnamate.

Examples of (meth)acryloyl-containing compounds (acryloyl and methacryloyl are hereinafter collectively denoted by (meth)acryloyl, while acrylate and methacrylate are hereinafter collectively denoted by (meth)acrylate) include compounds obtainable by esterification of an acrylic acid with a compound, having at least one hydroxyl group in a molecule, and compounds obtainable by esterification of an methacrylic acid with a compound having at least one hydroxyl group in a molecule.

The compound (A), in a preferred form, comprises a combination of a compound (A-1) having at lease one (meth)acryloyl group and at least one hydroxyl group in a molecule and a compound (A-2) having an unsaturated bond copolymerizable with the compound (A-1).

The compound (A-1) having at lease one (meth)acryloyl group and at least one hydroxyl group in a molecule is not particularly specified, and may be exemplified by the following: 2-hydroxyethyl(meth)acrylate, 3-hydroxypropyl (meth)acrylate, 2-hydroxypropyl(meth)acrylate, 4-hydroxybutyl(meth)acrylate, 2-hydroxybutyl(meth) acrylate, 5-hydroxypentyl(meth)acrylate, 6-hydroxyhexyl (meth)acrylate, 3-hydroxy-3-methylbutyl(meth)acrylate, 2-hydroxy-3-phenoxy-propyl(meth)acrylate, pentaerythritol tri(meth)acrylate, 2-[(meth)acryloyloxy]ethyl 2-hydroxyethyl phthalate, 2-[(meth) acryloyloxy]ethyl 2-hydroxypropyl phthalate, and compounds represented by the following formulas. (2)–(11).

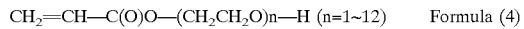
CH$_2$=CH—C(O) O—CH$_2$CH$_2$O—(C(O)CH$_2$CH$_2$CH$_2$CH$_2$O) n—H (n=1~10)　　　　　　　　　　　　　　Formula (2)

CH$_2$=C(CH$_3$)—C(O)O—CH$_2$CH$_2$O—
　(C(O)CH$_2$CH$_2$CH$_2$CH$_2$O)n—H (n=1~10)　　Formula (3)

CH$_2$=CH—C(O)O—(CH$_2$CH$_2$O)n—H (n=1~12)　　Formula (4)

CH$_2$=C(CH$_3$)—C(O)O—(CH$_2$CH$_2$O)n—H (n=1~12)　Formula (5)

CH$_2$=CH—C(O)O—(CH$_2$CH(CH$_3$)n—H (n=1~12)　Formula (6)

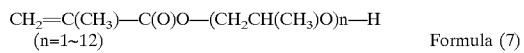
CH$_2$=C(CH$_3$)—C(O)O—(CH$_2$CH(CH$_3$)O)n—H
　(n=1~12)　　　　　　　　　　　　　　　　Formula (7)

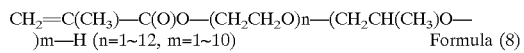
CH$_2$=C(CH$_3$)—C(O)O—(CH$_2$CH$_2$O)n—(CH$_2$CH(CH$_3$)O—
　)m—H (n=1~12, m=1~10)　　　　　　　　Formula (8)

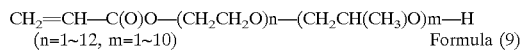
CH$_2$=CH—C(O)O—(CH$_2$CH$_2$O)n—(CH$_2$CH(CH$_3$)O)m—H
　(n=1~12, m=1~10)　　　　　　　　　　　　Formula (9)

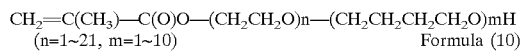
CH$_2$=C(CH$_3$)—C(O)O—(CH$_2$CH$_2$O)n—(CH$_2$CH$_2$CH$_2$CH$_2$O)mH
　(n=1~21, m=1~10)　　　　　　　　　　　　Formula (10)

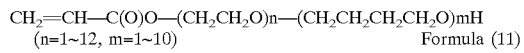
CH$_2$=CH—C(O)O—(CH$_2$CH$_2$O)n—(CH$_2$CH$_2$CH$_2$CH$_2$O)mH
　(n=1~12, m=1~10)　　　　　　　　　　　　Formula (11)

The above-listed compounds (A-1) may be used alone or in any combination thereof.

Likewise, the compound (A-2) having an unsaturated bond copolymerizable with the compound. (A-1) is not particularly specified, and may be exemplified by the following: acrylic acid, methacrylic acid, maleic anhydride, N-phenylmaleimide, N-cyclohexylmaleimide, (meth) acrylamide, N-vinylpyrrolidone, N-acryloylmorpholine, N-vinylcaprolactone, N-vinylpiperidine styrene, indene, p-methylstyrene, α-methylstyrene, p-chlorostyrene, p-chloromethylstyrene, p-methoxystyrene, p-tert-butoxystyrene, divinylbenzene, vinyl acetate, vinyl propionate, vinyl butyrate, vinyl caproate, vinyl benzoate, vinyl cinnamate, methyl(meth)acrylate, ethyl(meth)acrylate, propyl(meth)acrylate, n-butyl(meth)acrylate, tert-butyl (meth)acrylate, cyclohexyl(meth)acrylate, 2-ethylhexyl (meth)acrylate, n-octyl(meth)acrylate, isooctyl(meth) acrylate, isononyl(meth)acrylate, isomyristyl(meth)acrylate, stearyl(meth)acrylate, isobornyl(meth)acrylate, benzyl (meth)acrylate, 2-butoxyethyl(meth)acrylate, 2-phenoxyethyl(meth)acrylate, glycidyl(meth)acrylate, tetrahydrofurfuryl(meth)acrylate, hexane diol di(meth) acrylate, ethylene glycol di(meth)acrylate, polyethylene glycol di(meth)acrylate, propylene glycol di(meth)acrylate, polypropylene glycol di(meth)acrylate, neopentyl glycol di(meth)acrylate, trimethylolpropane tri(meth) acrylate, pentaerythritol di(meth)acrylate, pentaerythritol tri(meth) acrylate, pentaerythritol tetra(meth)acrylate, dipentaerythritol hexa(meth)acrylate, epoxy acrylate, polyester acrylate, urethane acrylate, and compounds represented by the following formulas (12)–(17).

CH$_2$=CH—C(O)O—(CH$_2$CH$_2$O)n—CH$_3$(n=1~10)　Formula (12)

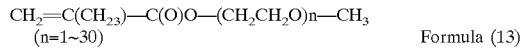
CH$_2$=C(CH$_{23}$)—C(O)O—(CH$_2$CH$_2$O)n—CH$_3$
　(n=1~30)　　　　　　　　　　　　　　　　Formula (13)

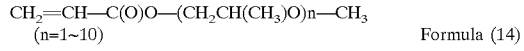
CH$_2$=CH—C(O)O—(CH$_2$CH(CH$_3$)O)n—CH$_3$
　(n=1~10)　　　　　　　　　　　　　　　　Formula (14)

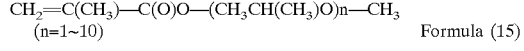
CH$_2$=C(CH$_3$)—C(O)O—(CH$_3$CH(CH$_3$)O)n—CH$_3$
　(n=1~10)　　　　　　　　　　　　　　　　Formula (15)

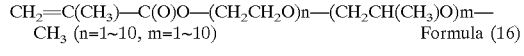
CH$_2$=C(CH$_3$)—C(O)O—(CH$_2$CH$_2$O)n—(CH$_2$CH(CH$_3$)O)m—
　CH$_3$ (n=1~10, m=1~10)　　　　　　　　　Formula (16)

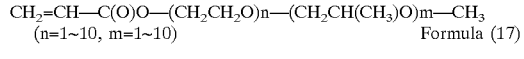
CH$_2$=CH—C(O)O—(CH$_2$CH$_2$O)n—(CH$_2$CH(CH$_3$)O)m—CH$_3$
　(n=1~10, m=1~10)　　　　　　　　　　　　Formula (17)

The above-listed compounds (A-2) may be used alone or in any combination. thereof.

Where the aforementioned compounds (A-1) and (A-2) are used in combination, they may be blended in any proportion. Preferably, the. amount of the compound (A-1) is adjusted to come within 1–10,000, parts by weight, based on 100 parts by weight of the compound (A-2). If the amount of compound (A-1) falls below 1 part by weight, a rate of radiation-induced cure may become too fast to insure a sufficient length of open time. On the other hand, if it exceeds 10,000 parts by weight, the curing may become too slow to proceed at a practical rate.

Examples of compounds (B) having at least one epoxy group in a molecule include, but not limited to, bisphenol A based epoxy resins, hydrogenated bisphenrol A based epoxy resins, bisphenol F based epoxy resins, novolac type epoxy resins, cycloaliphatic epoxy resins, brominated epoxy resins, rubber modified epoxy resins, urethane modified epoxy resins, glycidyl ester compounds, epoxidized polybutadiene, epoxidized SBS. (styrene-butadiene-styrene copolymer) and the like. The above-listed epoxy compounds, when cured, exhibit high degrees of adhesion and durability.

The above-listed epoxy compounds each having at least one-epoxy group per molecule may be used alone or in any combination. Also useful are compounds that contain a cationically polymerizable group other than the epoxy group in a molecule. Examples of such cationically polymerizable groups other than the epoxy group include vinyloxy, styryl, oxetanyl and the like.

The free-radical polymerization catalyst (C) is activated upon exposure to light to initiate polymerization of the compound (A). Such a free-radical polymerization catalyst is not particularly specified in type, so long as it is capable of initiating polymerization of the compound (A). Free-radical photopolymerization initiators known in the art can be used.

Examples of compounds which can-be used as the free-radical polymerization catalyst (C) include acetophenone derivatives such as 4-(2-hydroxyethoxy)phenyl(2-hydroxy-2-propyl)ketone, α-hydroxy-α,α'-dimethyl acetophenone, methoxy acetophenone and 2,2-dimethoxy-2-phenyl acetophenone; benzoin ether compounds such as benzoin ethyl ether and benzoin propyl ether; ketal derivatives such as benzyl dimethyl ketal; halogenated ketones; acylphosphine oxides, acylphosphonates; 2-methyl-1-[4-(methylthio)phenyl]-2-morpholino propane-1-on; 2-benzyl-2-N,N-dimethylamino-1-(4-morpholinophenyl)-1-butanone; 2,4,6-trimethylbenzoyl-diphenylphosphine oxide; bis-(2,6-dimethoxybenzoyl)-2,4,4-trimethylpentylphosphine oxide; bis(n5-cyclopentadienyl)-bis(pentafluorophenyl)-titanium; bis(n5-cyclopentadienyl)-bis[2,6-difluoro-3-(1H-pyri-1-yl)phenyl]-titanium.

The above-listed free-radical polymerization catalysts may be used alone or in any combination. Also useful are commercially available free-radical initiators which contain various compounds as specifically referred to above as free-radical initiators.

Preferably, the free-radical initiator (C) shows no sensitizing action against the onium salt compound (D) The onium-salt compound (D), responsive to irradiation, initiate polymerization of the compound (B), finally leading to cure of the photocurable composition. Examples of such onium salt compounds include, but not limited to, aromatic diazonium salts, aromatic iodonium salts, aromatic sulfonium salts and the like.

The above-listed onium salt compounds (D) may be used alone or in any combination.

Examples of commercial products useful for the onium salt compound include OPTOMER-SP-150 (product of Asahi Denka Ind. Co., Ltd.); OPTOMER SP-151 (product of Asahi Denka Ind. Co., Ltd.), OPTOMER SP-170 (product of Asahi Denka Ind. Co., Ltd.), OPTOMER SP-171 (product of Asahi Denka Ind. Co., Ltd.), UVE 1014 (product of General Electronics Co., Ltd.), CD 1012 (product of Sartomer), SANAID SI-60L (product of Sanshin Chem. Ind. Co., Ltd.), SANAID SI-80L (product of Sanshin Chem. Ind. Co., Ltd.), SANAID SI-100L (product of Sanshin Chem. Ind. Co., Ltd.), CI-2064 (product of Nippon Soda Co., Ltd.), CI-2639 (product of Nippon Soda Co., Ltd.), CI-2624 (product of Nippon Soda Co., Ltd.), CI-2481 (product of Nippon Soda Co., Ltd.), RHODORSIL PHOTOINITIATOR 2074 (product of Rhone Poulenc GmbH)., UVI-6990 (product of Union Carbide), BBI-103 (product of Midori Chem. Co., Ltd.), MPI-103 (product of Midori Chem. Co., Ltd.), TPS-103 (product of Midori Chem. Co., Ltd.), MDS-103 (product of Midori Chem. Co., Ltd.), DTS-103 (product of Midori Chem. Co., Ltd.), NAT-103 (product of Midori Chem. Co., Ltd.), NDS-103 (product of Midori Chem. Co., Ltd.) and the like. Cationic photocatalysts sold in the trade, such as metal complex salts, can also be used suitably. IRGACURE 261 (product of Ciba-Geigy) is a typical example.

In the case where the compounds (A) and (B) are sequentially subjected to polymerization, if an internal stress produced in the photocurable composition of this invention during polymerization or cure shrinkage is to be reduced to a minimum, it is preferred to combine them with a free-radical polymerization catalyst (C) activatable by exposure to radiation that includes wavelengths in the range of 370–800 nm and an onium salt compound (D) activatable by exposure to radiation that includes wavelengths-in the range of 300–370 nm.

In other words, it is desired that the free-radical polymerization catalyst (C) and onium salt compound (D) are photosensitive in the above-specified regions, respectively, because the onium salt compound (D) requires an increased exposure energy for its sensitization, compared to-the free-radical polymerization catalyst (D). If the free-radical polymerization catalyst (C) is photosensitive only to a radiation that includes wavelengths of below 370 nm, it becomes difficult to photoactivate the free-radical polymerization catalyst (C) only. On the other hand, if the free-radical polymerization catalyst (C) is photosensitive only to radiation that includes wavelengths of above 800 nm, it may become practically difficult to provide an exposure energy sufficient for the photocurable composition to cure at a desired rate, while possible to advance polymerization and cure reactions.

If the onium salt compound (D) is photosensitive only to radiation that includes wavelengths of below 300 nm, polymerization or cure of the photocurable composition may be caused to take place at its surface only, while possible to provide a sufficient exposure energy. The photocurable composition, if applied thick, may result in the difficulty to achieve a uniform cure thereof from its incident surface to deep inside. If the onium salt compound (D) is photosensitive only to radiation that includes wavelengths of above 370 nm, it may become practically difficult to apply an exposure energy sufficient for the photocurable composition to cure at a desired rate, while a cure reaction of the epoxy compound is allowed to proceed uniformly.

In the present invention, the aforestated compound (E) is not particularly specified, so long as it is a compound either represented by the formula (1) which indicates a cyclic structure containing ether and alkylene bonds, or having the cyclic structure represented by the formula (1) as a substituting group. Examples of compounds (E) include the compounds E-1 through E-5, respectively represented by the following formulas.

Compound E-1

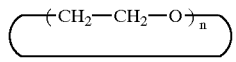

Compound E-2

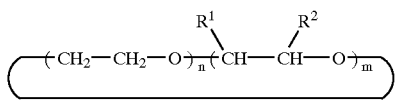

Compound E-3

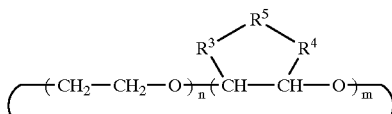

Compound E-4

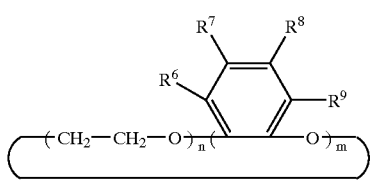

Compound E-5

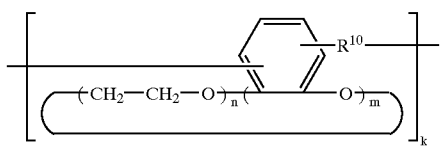

In the formulas which indicate the compositions E-1–E-S, $R^1$–$R^{10}$ are suitably selected from, but not limited to, hydrogen, halogen, saturated hydrocarbon groups, unsaturated hydrocarbon groups, substituting groups comprised of any suitable combination of elements such as carbon, hydrogen, oxygen, nitrogen and sulfur, and the like. m, n and k are all integers.

While not limiting, the compounds E-1 through E-S may have their respective repeating units arranged in a block or random fashion, as represented by the above formulas.

Specific examples of compounds represented by the formula (1) include, but not limited to, 12-crown-4, 15-crown-5, 18-crown-6, 24-crown-8, 30-crown-10, 2-aminomethyl-12-crown-4, 2-aminomethyl-15-crown-5, 2-aminomethyl-18-crown-6, 2-hydroxymethyl-12-crown-4, 2-hydroxymethyl-15-crown-5, 2-hydroxymethyl-18-crown-,6, dicyclohexano-18-crown-6, dicyclohexano-24-crown-8, dibenzo-18-crown-6, dibenzo-24-crown-8, dibenzo-30-crown-10, benzo-12-crown-4, benzo-15-crown-5, benzo-18-crown-6, 4'-aminobenzo-15-crown-5, 4'-bromobenzo-15-crown-5, 4'-formylbenzo-15-crown-5, 4'-nitrobenzo-15-crown-5, bis[(benzo-15-crown-5)-15-ylmethyl]pimelate, poly[(dibenzo-18-crown-6)-co-formaldehyde], and the like. These compounds may be used alone or in combination.

(Blending Proportions)

Blending proportions of formulation ingredients of the first photocurable composition according to the present invention are not particularly specified. However, the blend may preferably contain, by weight, 1–10,000 parts of the compound (B), 0.001–100 parts of the free-radical polymerization catalyst (C), 0.001–1,000 parts of the onium salt compound (D) and 0.00001–10,000 parts of the compound (E), based on 100 parts of the compound (A).

The second photocurable composition, because of its inclusion of the tackifying polymer (A.3) made via photo polymerization of the compound (A), preferably contains the above-specified blending proportions of the compounds (B), (D) and (E), based on 100 parts tackifying polymer (A-3).

If the compound (B) is added in the amount of below 1 part by weight, its adhesion-imparting effect may not be obtained. On the other hand, if it is added in. the amount of exceeding 10,000 parts by weight, a final proportion of the tackifying polymer (A-3) may become too low to produce an expected tack-imparting effect thereof.

If the free-radical polymerization catalyst (C) is incorporated in the amount of below 0.001 parts by weight, the concentration of active species produced by irradiation may be lowered to result in the difficulty to achieve polymerization at a satisfactory rate. In contrast, if it is incorporated in the amount of above 100 parts by weight, the concentration of active species produced by irradiation may be increased excessively to result in the difficulty to control a rate of polymerization.

If the onium salt compound (D) is incorporated in the amount of below 0.001 parts by weight, the concentration of active species produced by irradiation may be lowered to result in the difficulty to achieve curing at a satisfactory rate. In contrast, if it is incorporated in the amount of above 1,000 parts by weight, the concentration of active species produced by irradiation may be increased excessively to result in the difficulty to control a cure rate.

If the compound (E) is incorporated in the amount of below 0.00001 parts by weight, it may fail to provide an expected result of extending an open time. On the other hand, if it is incorporated in the amount of above 10,000 parts by weight, the start of a polymerization or cure reaction-of the compound (B) may be delayed extensively to fall in a condition as if the cure reaction of the compound (B) is substantially ceasing, while a sufficient open time is assured.

For the second photocurable composition, the tackifying polymer (A-3) is made via polymerization of the compound (A). Accordingly, the free-radical polymerization catalyst (C) is excluded.

If stated differently, the second photocurable composition which contains the compound (B), onium salt compound (D) and compound (E) is obtained by irradiating the first photocurable composition so that the free-radical polymerization catalyst (C) therein is activated to initiate polymerization of the compound (A).

The aforementioned tackifying polymer (A-3) may have any arbitrary structure, e.g., in the form of a general homopolymer, random copolymer, block copolymer, alternating copolymer, stereoregular (co)polymer, polybranched (co)polymer, star (co)polymer, treelike (co)polymer, ladder (co)polymer, cyclic (co)polymer or helix (co)polymer. The (co)polymer indicates both of a homopolymer and a copolymer.

The molecular weight of the tackifying polymer (A-3) is not particularly specified, but is preferably high. The tackifying polymer preferably has a weight average molecular weight in the range of 20,000–5,000,000. If the weight average molecular weight is below 20,000, the polymer when sheeted may exhibit insufficient cohesion, resulting in the occurrence of webbing during its application that causes frequent delamination. If above 5,000,000, the vicosity of the composition containing the tackifying polymer (A-3) and compound (B) may be increased to result in the difficulty to render it into a sheet form.

Preferably, the second photocurable composition may be prepared by irradiating the first photocurable composition containing the compounds (A)–(E) so that the free-radical polymerization catalyst (C) is activated to initiate polymerization of the compound (A). This method is preferred for its capability to omit a procedure of mixing the tackifying polymer (A-3) with a combination of the compound (B), onium salt compound (D) and compound (E).

A radiation source used to activate the free-radical polymerization catalyst (C) generally has an emission distribution in the 370–800 nm region. Suitable sources of radiation include low-pressure mercury lamps, medium-pressure mercury lamps, high-pressure mercury lamps, ultrahigh-pressure mercury lamps, chemical lamps, blacklight lamps, microwave-excited mercury lamps, metal halide lamps, fluorescent lamps and the like. Here, a radiation may be adjusted to exclude wavelengths of below 370 nm so that the onium salt compound (D) is-maintained unreacted.

(Photocurable Pressure-Sensitive Adhesive Sheet)

The second photocurable composition, when sheeted, provides a photocurable pressure-sensitive adhesive sheet. The form of photocurable pressure-sensitive adhesive sheet is desired since it can ease adjustment of coating weight and thickness of the photocurable composition during a joint operation.

The sheeting procedure is not particularly specified. The photocurable composition can be sheeted by utilizing suitable sheeting techniques known in the art, such as hotmelt or cast coating. The following procedure is preferred for its capability to simplify a manufacturing process: The first photocurable composition containing the compounds (A)–(E). is rendered into a sheet form and then irradiated so that the free-radical initiator therein is activated to initiate polymerization of the compound (A)

(Joining Process).

Where the photocurable pressure-sensitive adhesive sheet in accordance with the present invention is utilized to join adherends together, the photocurable pressure-sensitive adhesive sheet is preferably irradiated, either before or after it is applied to the adherend(s), so that the onium salt compound (D) is activated. The adherends are thereafter brought in contact with each other. Preferably, the onium salt compound (D) is exposed to a radiation having wavelengths of 300–370 nm so that it receives an energy exposure of 100 mJ/cm$^2$ or higher. If the energy exposure is below 100 mJ/cm$^2$, it may become difficult to activate the onium salt compound (D) sufficiently.

(Other Useful Ingredients)

Besides the above-described essential ingredients, a known tackifer, extender, sensitizer or the like may be suitably incorporated into the photocurable composition or photocurable pressure-sensitive adhesive sheet in accordance with the present invention within the range that does not impede the purposes of the present invention.

Examples of tackifiers include rosin resins, modified rosin resins, terpene resins, terpene-phenolic reins, aromatic modified terpene resins, C5 or C9 petroleum resins, coumarone resins and the like. Particularly when adherends consist of polyolefins, the use of rosin or petroleum resins is preferred for their ability to build strong adhesion.

Examples of sensitizers include anthracene, perylene, coronene, tetracene, benzanthracene, phenothiazine, flavin, acridine, ketocoumarin, thioxanthone derivatives, benzophenone, acetophenone, 2-chlorothioxanthone, 2,4-dimethylthioxanthone, 2,4-diethylthioxanthone, 2,4-diisopropylthioxanthone, isopropylthioxanthone and the like.

Other materials which exhibit the ability to increase a sensitivity of the composition are also useful.

Other additives can also be added to improve coating properties, examples of which include thickeners such as acrylic, epichlorohydrin, iroprene and butyl rubbers; thixotropic agents such as colloidal silica and polyvinyl pyrrolidone; extenders such as calcium carbonate, titanium oxide and clay; and adjusting agents such as polyester, acrylic polymer, polyurethane, silicone, polyether, polyvinyl ether, polyvinyl chloride, polyvinyl acetate, polyisobutylene and waxes.

Where the photocurable composition in accordance with the present invention is utilized as an adhesive, suitable materials can be added to improve its shear bond strength, examples of which include. inorganic balloons as comprised of glass, alumina and ceramic; organic spheres such as nylon, acrylic and silicon beads; organic balloons as comprised of vinylidene chloride and acrylics; and single-component fibers such as comprised of glass, polyester, rayon, nylon, cellulose and acetate.

The glass fibers can be added, in the form of fibrous chips, to the composition. The improved shear bond strength is obtained if the photocurable composition is polymerized in the-form of being impregnated in a glass woven fabric.

(Pressure-Sensitive Adhesive Product)

The photocurable pressure-sensitive adhesive sheet in accordance with the present invention, when applied onto at least one surface or portion of a substrate, provides a pressure-sensitive adhesive product. That is, the photocurable pressure-sensitive adhesive sheet in accordance with the present invention may take the form that precludes a substrate, or the form of being placed on at least one surface or portion of a substrate as a pressure-sensitive adhesive layer.

Examples of useful substrates include, but not limited to, nonwoven fabrics such as of rayons or celluloses; synthetic resin films or sheets such as of polyethylene, polyester, polystyrene, cellophane, polypropylene and polyimide; foams such as of polyethylene, urethane and vinyl chloride; synthetic resin plates such as of polyethylene, polyester, polystyrene, acrylics, ABS, polypropylene, rigid vinyl chloride and polycarbonate; metal sheets or plates such as of steel, stainless steel, aluminum, copper and plated steel; glass; ceramics; wood; paper; cloth and the like. Such substrates may have various shapes, e.g., thin forms such as a sheet or plate, prism, rod, configurations having an aspherical surface, or the like.

(Action)

If the first photocurable composition containing the compounds (A) through (E) is irradiated properly, the free-radical polymerization catalyst (C) is activated to initiate polymerization of the compound (A), resulting in the production of the tackifying polymer (A-3). Accordingly, the first photocurable composition, when such irradiated, produces the second photocurable composition which contains the tackifying polymer (A-3) having a sufficient pressure-sensitive adhesive property, as well as the compounds. (B), (D) and (E).

Particularly when the compound (A) comprises a combination of the compound (A-1) having a (meth)acryloyl groups and at least one hydroxyl group and the compound (A-2), the tackifying polymer (A-3) made via copolymerization thereof exhibits the further improved pressure-sensitive adhesive property.

By exposing-the photocurable composition to radiation sufficient to activate the onium salt compound (D), the compound (B) is caused to undergo polymerization and cure to provide a rigid and adherent cured product. In the case where this photocurable composition is used as an adhesive, the utilization of light allows its application even to adherends which suffer from poor resistance to heat.

Also, the incorporation of the compound (E) extends a period of time the photocurable composition remains uncured after it has been-irradiated, i.e., an open time, to a sufficient degree, while assuring adhesive property. This is considered due to the inclusion of cyclic ether in the compound (E) represented by the formula (1).

The photocurable composition may be designed such that the free-radical polymerization catalyst (C) is activatable by exposure to radiation that includes wavelengths in the range of 370–800 nm while the onium salt compound (D) is activatable by exposure to radiation including wavelengths in the range of 300–below 370 nm. Exposure of the photocurable composition initially to radiation that includes wavelengths of 370 nm and longer but excludes wavelengths of below 370 nm allows sole activation of the free-radical polymerization catalyst (C) leading to production of the tackifying polymer (A-3), while preventing activation of the onium salt compound (D). Subsequent exposure to radiation that includes wavelengths of below 370 nm allows activation of the onium salt compound (D) whereby the photocurable composition can be caused to cure.

That is, if the free-radical polymerization catalyst (C) and the onium salt compound (D) are selected such that they are photoactivated in different wavelength regions, as stated above, a process of producing a photocurable composition containing the tackifying polymer (A-3) and the compounds (B), (D) and (E) and a process. of curing the photocurable composition can be readily practiced. simply by irradiating a photocurable composition containing the compounds (A)–(E) twice.

As described above, the second photocurable composition containing the tackifying polymer (A-3) and the compounds (B), (D) and (E), if exposed to radiation sufficient to activate the onium salt compound (D), provides a rigid and adhesive cured product via-cure of the compound (B). In particular, the incorporation of compound (E) represented by the formula (1) reduces the occurrence of a so-called skinning phenomenon after irradiation, provides a sufficient length of open time, and assures a good adhesive property. Due to the tackiness of the tackifying polymer (A-3), the photocurable composition easily adheres to an adherend, both prior to and immediately after exposure to radiation sufficient to activate the onium salt compound (D).

In the production method of a photocurable composition according to the present invention, the second photocurable composition can be readily obtained-by exposing the first photocurable composition to radiation sufficient to activate the free-radical polymerization catalyst (C).

The photocurable pressure-sensitive adhesive sheet in accordance with the present invention is made by rendering the second photocurable composition into a sheet form. This allows application of the photocurable composition to an adherend with consistent coating weight and thickness.

In the production method of a photocurable pressure-sensitive adhesive sheet according to the present invention, the photocurable pressure-sensitive adhesive sheet is obtained by coating and irradiating the first photocurable composition so that the free-radical polymerization catalyst (C) therein is activated to produce the tackifying polymer (A-3). This method thus enables easy production of the photocurable pressure-sensitive adhesive sheet according to the present invention by two simple operations, i.e., coating and irradiation.

BEST MODE FOR CARRYING OUT THE INVENTION

The present invention is now described in more detail by way of non-liming examples.

EXAMPLE 1

500 g of ethyl acrylate as the compound (A), 500 g of an epoxy resin (product name: EPICOAT 828, manufactured by Yuka-Shell Epoxy Co., Ltd.) as the compound (B), 1 g of bis (2, 6-dimethoxybenzoyl) -2,4, 4-trimethylpentylphosphine oxide (product name: IRGACURE 1700, manufactured by Ciba Geigy Co., Ltd.) as the free-radical polymerization catalyst (C), 5 g of OPTOMER SP-170 of Asahi Denka Ind. Co., Ltd. as the onium salt compound (D), and 5 g of 18-crown-6 (product of Wako Jyunyaku Co., Ltd.) as the compound (E) were mixed with stirring in a. 2-liter separable flask to homogenity. Thereafter, the mixture was bubbled with nitrogen for 20 minutes to remove oxygen. As a result, a photocurable composition was obtained.

The above-obtained photocurable composition was coated on a release-surfaced polyethylene terephthalate film to a thickness of 0.3 mm. Another release-surfaced polyethylene terephthalate film was placed thereon to cover the coating film. As a result, a laminate was obtained incorporating a layer of the photocurable composition interposed between the two release-surfaced polyethylene terephthalate films.

A fluorescent lamp with a maximum emission wavelength of 400 nm was utilized to expose the laminate to a near ultraviolet light that substantially excluded wavelengths of 360 nm and below at an intensity of 1 $mW/cm^2$ for 10 minutes. As a result, the compound (A) was free-radically polymerized to produce a photocurable pressure-sensitive adhesive sheet comprised of a photocurable composition containing the above-specified compound (B), onium salt compound (D) and compound (E).

EXAMPLES 2–14 AND COMPARATIVE EXAMPLES 1–9)

The procedure of Example 1 was repeated, except that the initial formulation was changed to those indicated in Tables 1 and 2, to obtain photocurable compositions and. photocurable pressure-sensitive adhesive sheets.
(Evaluation of Examples and Comparative Examples)

The above-obtained photocurable pressure-sensitive adhesive sheets were evaluated for (1) SUS shear bond strength, (2) open time and (3) cure completion time according to the following procedures.

(1) SUS Shear Bond Strength Evaluation

Each photocurable pressure-sensitive adhesive sheet is cut to a size of 25×25 mm. Such-sized photocurable pressure-sensitive adhesive sheet is applied onto a 30 mm wide, 150 mm long and 2 mm thick stainless steel plate (SUS 304, hereinafter referred to as an adherend A) whose surface has been previously abraded with a #280 wet abrasive paper, degreased with ethyl acetate and dried. The photocurable pressure-sensitive adhesive sheet is then exposed to light in the range of 300–370 nm at an intensity of 30 $mW/cm^2$ for 30 seconds. Immediately after exposure to light, the polyethylene terephthalate film is peeled from a surface of the photocurable pressure-sensitive adhesive sheet which is subsequently applied onto a separately-prepared second adherend A. As a result, a sample piece for shear bond strength is obtained incorporating a pair of adherends A, A joined together by an intervening photocurable pressure-sensitive adhesive sheet.

The sample piece is allowed to cure for 7 days and then measured for shear bond strength using a tensile machine at a pulling speed of 10 mm/min according to Jis Z 6850.

(2) Open Time Evaluation

In the above shear bond strength evaluation (1), the photocurable pressure-sensitive adhesive sheet is: applied to another adherend A immediately after it is irradiated. However in this evaluation, the irradiated photocurable pressure-sensitive adhesive sheet is applied to another adherend A after specified time intervals. Otherwise, the procedure of the shear bond strength evaluation (1) was followed to obtain pieces for shear bond strength test. These test pieces are left to cure in the same manner as in the above evaluation (1) and then subjected to shrear bond strength measurement. In this case, the time interval after which the irradiated. pressure-sensitive adhesive sheet is applied to another adhrend is varied. If the measured shear bond strength value comes close to that measured for the test piece assembled immediately after irradiation as practiced in the shear bond strength evaluation (1), it is understood that the test piece has been assembled within an open time. Therefore, a maximum time interval that permits the assembly of the test piece which shows an adhesive bond strength about comparable in value to that measured for the test piece assembled in the shear bond strength evaluation (1) is defined as an open time.

(3) Cure Completion Time Evaluation

The procedure of the shear bond strength evaluation (1) is followed to prepare pieces for shear bond strength test. Each test piece, after the adherends have been left in contact with each other for specified periods of time, is measured for shear bond strength according to JIS Z 6850. A maximum period of time during which the shear bond strength has approached in. value to saturation is defined as a cure completion time.

TABLE 1

| | | | Ex. 1 | Comp. Ex.1 | Ex. 2 | Comp. Ex. 2 | Ex. 3 | Comp. Ex. 3 |
|---|---|---|---|---|---|---|---|---|
| Formulation Ingredients (p.b.w.) | Compound (A) | Ethyl Acrylate | 50 | 50 | | | | |
| | | Glycidyl Methacrylate | | | 50 | 50 | 50 | 50 |
| | Compound (B) | Epicoat 828 | 50 | 50 | 50 | 50 | 25 | 25 |
| | | BEO-60E | | | | | 25 | 25 |
| | Free-radical Intiator (C) | Ig-1700 | 0.1 | 0.1 | 0.1 | 0.1 | 0.1 | 0.1 |
| | Compound (D) | SP-170 | 0.5 | 0.5 | 0.5 | 0.5 | 0.5 | 0.5 |
| | Compound (E) | 18-Crown-6 | 0.5 | | 0.5 | | 0.5 | |
| Evaluation Items | Open Time (Min) | | 60 | 10 | 45 | 5 | 60 | 10 |
| | Cure Completion Time (Hr) | | 24 | 24 | 24 | 24 | 24 | 24 |
| | Shear Bond Strength (kgf/cm$^2$) | Applied Immediately After Irradiation | 58 | 60 | 29 | 32 | 54 | 56 |
| | | Applied 30 min. After Irradiation | 62 | 13 | 26 | 8 | 55 | 12 |

Remark)
Epicoat 828: Bisphenol A Based Epoxy Resin (Product of Yuka-Shell Epoxy)
BEO-60E: Epoxy Resin (Product of Shin Nippon Rika)
Ig-1700: Irgacure-1700 (Product of Ciba Gaigy)
SP-170: Optomer SP-170 (Product of Asahi Denka)
18-Crown-6: Compound E1, n = 6 (Product of Wako Jyunyaku)

TABLE 2

| | | | Ex. | | | | | | Comp. Ex. | Ex. | Comp. Ex. |
|---|---|---|---|---|---|---|---|---|---|---|---|
| | | | 4 | 5 | 6 | 7 | 8 | 9 | 4 | 11 | 5 |
| Formulation Ingredients (p.b.w.) | Compound (A1) | Compound 2 (N = 2) | 20 | 20 | 20 | 20 | 20 | 20 | 20 | 20 | 20 |
| | Compound (A2) | Tetrahydrofurfuryl Acrylate | 30 | 30 | 30 | 30 | 30 | 30 | 30 | 30 | 30 |
| | Compound (B) | Epicoat 828 | 30 | 30 | 30 | 30 | 30 | 30 | 30 | 30 | 30 |
| | | BEO-60E | 20 | 20 | 20 | 20 | 20 | 20 | 20 | 20 | 20 |
| | Free-radical Intiator (C) | Ig-1700 | 0.1 | 0.1 | 0.1 | 0.1 | 0.1 | 0.1 | 0.1 | 0.1 | 0.1 |
| | Compound (D) | SP-170 | 0.5 | 0.5 | 0.5 | 0.5 | 0.5 | 0.5 | 0.5 | 1.0 | 1.0 |
| | Compound (E) | 18-Crown-6 | 1.0 | 0.5 | 0.1 | | | | | | |
| | | 15-Crown-5 | | | | 0.5 | | | | | |
| | | Dibenzo 18-crown-6 | | | | | 0.5 | | | | |
| | | Poly [(Dibenzo 18-Crown-6)-Co-Formaldehyde] | | | | | | 0.5 | | | |
| Evaluation Items | Open Time (Min) | | 120 | 60 | 30 | 60 | 30 | 30 | 5 | 30 | 5 |
| | Cure Completion Time (Hr) | | 24 | 24 | 24 | 24 | 24 | 24 | 24 | 12 | 12 |
| | Shear Bond Strength (kgf/cm$^2$) | Applied Imm. After Irr. | 97 | 101 | 104 | 100 | 99 | 103 | 98 | 106 | 110 |
| | | Applied 30 min. After Irr. | 101 | 104 | 96 | 103 | 109 | 105 | 17 | 108 | 13 |

Remark)
Compound 2: Praxel FM-2D (Product of Daicel)
Epicoat 828: Bisphenol A Based Epoxy Resin (Product of Yuka-shell Epoxy)
Beo-60e: Epoxy Resin (Product of Shin Nippon Rika)
Ig-1700: Irgacure-1700 (Product of Ciba Gaigy)
SP-170: Optomer Sp-170 (Product of Asahi Denka)
18-Crown-6: Compound E1, n = 6 (Product of Wako Jyunyaku)
Dibenzo 18-Crown-6: Compound E4, n = 4, m = 2, R = Hydrogen(Product of Tokyo Kasei)
Poly [(Dibenzo 18-Crown-6)-Co-Formaldehyde]: Compound E4, n = 4, m = 2, R = Methylene (Product of Aldrich)

As will be apparent from Table 1, the photocurable compositions of Comparative Examples 1–3 exclude the composition (E), but otherwise correspond in formulation to those of Examples 1–3, respectively. However, due probably to the exclusion of compound (E), the photocurable compositions of Comparative Examples 1–3 each exhibits a very short open time, 10 minutes or below, as well as providing an insufficient shear bond strength unless they are applied to an adherend immediately after irradiation.

In contrast, the photocurable compositions obtained in Examples 1–3, respectively corresponding to those of Comparative Examples 1–3, exhibit the increased open time, 45 minutes or longer, and can provide sufficient shear bond strength even if they are applied to an adherend 30 minutes after they are irradiated.

As can also be seen from Table 2, due probably to the exclusion of compound (E), the photocurable compositions of Comparative Examples 4 and 5 each exhibits a very short open time of 5 minutes, as well as providing insufficient shear bond strength unless applied to an adherend immediately after irradiation. On the other hand, the photocurable compositions obtained in corresponding Examples 4–9 and 10 exhibit the increased open time, 30 minutes or longer, and provide sufficient shear bond strength even if they are applied to an adherend 30 minutes after they are irradiated.

EFFECT OF THE INVENTION

The first photocurable composition of the present application contains the compound (A) having at least one free-radically polymerizable unsaturated bond per molecule, the compound (B), the free-radical polymerization catalyst (C), the onium salt compound (D) and the compound (E) of the formula (1). When it is exposed to radiation sufficient to activate the free-radical polymerization catalyst (C), the compound (A) is caused to undergo polymerization to produce the tackifying polymer (A-3). This facilitates production of the second photocurable composition.

The second photocurable composition, because of its inclusion of tackifying polymer (A-3), exhibits a sufficient pressure-sensitive adhesive property that initially enables easy application thereof to an adherend. Also, when the second photocurable composition it is exposed to radiation sufficient to activate the onium salt compound (D), curing of the compound (B) is initiated to build adhesive strength.

Since the photocurable composition is allowed to cure upon exposure to radiation, it can be readily applied even to an adherend that suffers from poor resistance to heat. Also, the incorporation of compound (E) assures a sufficient open time to ease, a series of operations from irradiation till application.

In the case where the compound (A) comprises a combination of the compound (A-1) having a (meth)acryloyl groups and at least one hydroxyl group per molecule and the compound (A-2) having an unsaturated bond copolymerizable with the compound (A-1), when the photocurable composition is exposed to radiation sufficient to activate the free-radical polymerization catalyst (C), those compounds (A-1) and (A-2) are induced to copolymerize to produce a copolymer in the form of the tackifying polymer (A-3). As a result, the photocurable composition has imparted thereto excellent initial cohesion and pressure-sensitive adhesive property.

Where the photocurable composition contains the free-radical polymerization catalyst and onium salt compound (D) both activatable by the irradiation in the above-specified wavelength regions and where the free-radical polymerization catalyst (C) used is activatable by exposure to radiation that includes wavelengths in the range of 300–370 nm to initiate polymerization or cure of at least the compound (B), initial exposure of the photocurable composition to radiation that excludes wavelengths of below 370 nm allows production of the photocurable composition according to the second invention, while preventing activation of the onium salt compound (D).

In the method for producing a photocurable composition in accordance with the present invention, simple exposure of the first photocurable composition to radiation sufficient to activate the radical polymerization catalyst (C) allows initiation of polymerization of the compound (A) to result in production of the tackifying polymer (A-3). This eases production of the second photocurable composition.

The photocurable pressure-sensitive adhesive sheet in accordance with the present invention,is made by rendering the second photocurable composition into a sheet form. This sheet-form allows application of photocurable composition to adherends with consistent coating weight and thickness, so that the adherends can be readily joined together.

In the method for producing a photocurable pressure-sensitive adhesive sheet according to the present invention, the first photocurable composition is coated and then exposed to radiation sufficient to activate the free-radical polymerization catalyst (C) so that polymerization of the compound (A) is initiated. This method thus enables easy production of the photocurable pressure-sensitive adhesive sheet.

What is claimed is:
1. A photocurable composition comprising:
   (A) a compound having at least one free-radically polymerizable unsaturated bond in a molecule;
   (B) a compound having at least one epoxy group in a molecule;
   (C) a photoactivatable free-radical polymerization catalyst which is activatable by irradiation for initiating polymerization of the compound A;
   (D) a photoactivatable onium salt compound functioning as a cationic polymerization catalyst; and
   (E) a compound represented by the following formula (1);
   (Formula (1)

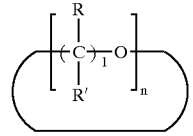

wherein R and R' are selected from hydrogen, halogen, saturated hydrocarbon groups, unsaturated hydrocarbon groups, substituting groups comprised of any combination of elements such as carbon, hydrogen, oxygen, nitrogen and sulfur; and 1, and n each is an integer of 2 or larger, wherein the wavelength of light capable of activating the photoactivatable free-radical polymerization catalyst (C) is different from the wavelength of light capable of photoactivating the photoactivatable onium salt (D).

2. The photocurable composition as recited in claim 1, wherein said compound (A) contains a compound (A-1) having at least one (meth)acryloyl group and at least one hydroxyl group in a molecule and a compound (A-2) having an unsaturated bond copolymerizable with the compound (A-1).

3. The photocurable composition as recited in claim 1, wherein said compound (C) is a photoactivatable free-radical polymerization catalyst activatable by exposure to radiation that includes a wavelength region of 370–800 nm to initiate polymerization of at least the compound (A), and wherein said compound (D) is a photoactivatable onium salt compound activatable by exposure to radiation that includes a wavelength region of 300–370 nm to initiate polymerization or cure of at least the compound (B).

4. A photocurable composition comprising:
(A-3) a tackifying polymer made via photo polymerization of a Ad compound (A) having at least one free-radically polymerization unsaturated bond in a molecule;
(B) a compound having at least one epoxy group in a molecule;
(D) an onium salt compound functioning as a cationic polymerization catalyst; and
(E) a compound represented by the following formula (1):
Formula (1)

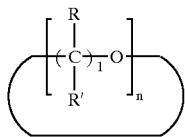

wherein R and R' are selected from hydrogen, halogen, saturated hydrocarbon groups, unsaturated hydrocarbon groups, substituting groups comprised of any combination of elements such as carbon, hydrogen, oxygen, nitrogen and sulfur; and 1, and n each is an integer of 2 or larger.

5. A method for producing a photocurable composition by the step of exposing the photocurable composition as recited in claim 1 to radiation sufficient to activate the free-radical polymerization catalyst (C) so that polymerization of the compound (A) is initiated.

6. A photocurable pressure-sensitive adhesive sheet obtained by forming the photocurable composition as recited in claim 4 into a sheet.

7. A method for producing a photocurable pressure-sensitive adhesive sheet by the steps of, in sequence, forming a coating of the photocurable composition as recited in claim 1, and exposing the coated photocurable composition to radiation sufficient to activate the free-radical polymerization catalyst (C) to thereby initiate polymerization of the compound (A).

8. The photocurable composition of claim 2, wherein said compound (C) is a photoactivatable free-radical polymerization catalyst activatable by exposure to radiation that includes a wavelength region of 370–800 nm to initiate polymerization of at least the compound (A), and wherein said compound (D) is a photoactivatable onium salt compound activatable by exposure to radiation that includes a wavelength region of 300–370 nm to initiate polymerization or cure of at least the compound (B).

9. A method for producing a photocurable composition characterized by exposing the photocurable composition as recited in claim 2 to radiation sufficient to activate the free-radical polymerization catalyst (C) so that polymerization of the compound (A) is initiated.

10. A method for producing a photocurable composition by exposing the photocuraable composition as recited in claim 3 to radiation sufficient to activate the free-radical polymerization catalyst (C) so that polymerization of the compound (A) is initiated.

11. A method for producing a photocurable pressure-sensitive adhesive sheet by the steps of, in sequence, forming a coating of the photocurable composition as recited in claim 2, and exposing the coated photocurable composition to radiation sufficient to activate the free-radical polymerization catalyst (C) to thereby initiate polymerization of the compound (A).

12. A method for producing a photocurable pressure-sensitive adhesive sheet by the steps of, in sequence, forming a coating of the photocurable composition as recited in claim 3, and exposing the coated photocurable composition to radiation sufficient to activate the free-radical polymerization catalyst (C) to thereby initiate polymerization of the compound (A).

* * * * *